United States Patent
Beyer et al.

(10) Patent No.: US 8,283,232 B2
(45) Date of Patent: Oct. 9, 2012

(54) ENHANCED ETCH STOP CAPABILITY DURING PATTERNING OF SILICON NITRIDE INCLUDING LAYER STACKS BY PROVIDING A CHEMICALLY FORMED OXIDE LAYER DURING SEMICONDUCTOR PROCESSING

(75) Inventors: Sven Beyer, Dresden (DE); Berthold Reimer, Dresden (DE); Falk Graetsch, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 348 days.

(21) Appl. No.: 12/785,849

(22) Filed: May 24, 2010

(65) Prior Publication Data

US 2010/0304542 A1 Dec. 2, 2010

(30) Foreign Application Priority Data

May 29, 2009 (DE) .......................... 10 2009 023 250

(51) Int. Cl.
*H01L 21/336* (2006.01)
(52) U.S. Cl. ................................. 438/287; 257/E21.444
(58) Field of Classification Search .................. 438/634, 438/938, 958, 970
See application file for complete search history.

(56) References Cited

U.S. PATENT DOCUMENTS

| 6,987,065 B2* | 1/2006 | Sorada et al. ............... 438/700 |
| 7,271,045 B2* | 9/2007 | Prince et al. ............... 438/199 |
| 2010/0133615 A1 | 6/2010 | Mulfinger et al. ............ 257/347 |

FOREIGN PATENT DOCUMENTS

DE 102008059646 A1 6/2010

OTHER PUBLICATIONS

Translation of Official Communication from German Patent Office for German Patent Application No. 10 2009 023 250.8 dated Nov. 4, 2010.

* cited by examiner

*Primary Examiner* — Chandra Chaudhari
(74) *Attorney, Agent, or Firm* — Williams, Morgan & Amerson, P.C.

(57) ABSTRACT

A gate electrode structure may be formed on the basis of a silicon nitride cap material in combination with a very thin yet uniform silicon oxide based etch stop material, which may be formed on the basis of a chemically driven oxidation process. Due to the reduced thickness, a pronounced material erosion, for instance, during a wet chemical cleaning process after gate patterning, may be avoided, thereby not unduly affecting the further processing, for instance with respect to forming an embedded strain-inducing semiconductor alloy, while nevertheless providing the desired etch stop capabilities during removing the silicon nitride cap material.

25 Claims, 6 Drawing Sheets

ENHANCED ETCH STOP CAPABILITY DURING PATTERNING OF SILICON NITRIDE INCLUDING LAYER STACKS BY PROVIDING A CHEMICALLY FORMED OXIDE LAYER DURING SEMICONDUCTOR PROCESSING

BACKGROUND OF THE INVENTION

1. Field of the Invention

Generally, the present disclosure relates to the fabrication of sophisticated integrated circuits including complex layer stacks, such as gate layer stacks of highly capacitive gate structures formed on the basis of a high-k gate dielectric and metal-containing electrode materials.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. During the very complex fabrication process, typically, material systems have to be formed and patterned, for instance, by wet chemical processes and plasma assisted etch processes, wherein usually one or more material layers may be provided as sacrificial layers, while other materials may represent permanent materials in the form of conductive, dielectric and semiconductive materials. The patterning process typically relies on the different etch rates of the materials with respect to an appropriate etch recipe such that a desired pattern may be transferred from a lithography mask into the material system under consideration. For example, a plurality of organic materials, such as photoresist materials and the like, may have a reduced etch rate compared to the plurality of materials that are typically used in the semiconductor fabrication process. Moreover, well-established dielectric materials, such as silicon dioxide based dielectrics and silicon nitride based dielectrics, may be provided with varying material characteristics, so that efficient etch stop capabilities may be provided on the basis of these materials in situations when superior integrity in view of elevated temperatures and the like is required. For example, a plurality of wet chemical etch recipes and plasma assisted etch recipes are available in which silicon dioxide and silicon nitride may be selectively etched by using the other material as an etch stop. Upon continuously reducing the feature sizes of circuit elements, however, the material systems may have to be provided with reduced thickness and additional complex processes may have to be applied, thereby resulting in an undue interaction of aggressive process environments with the delicate layers.

One prominent example of patterning a delicate layer system is the formation of gate electrode structures of sophisticated field effect transistors, which represent one important type of circuit element that substantially determines performance of complex integrated circuits. Generally, a plurality of process technologies are currently practiced, wherein, for many types of complex circuitry including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, e.g., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Consequently, the process of patterning a gate electrode structure may require very sophisticated process techniques, beginning from the deposition of appropriate material layers, such as gate dielectrics, the silicon material which may typically be used as an electrode material, followed by the deposition of any further materials, such as hard mask materials, anti-reflective coating (ARC) materials and the like, which may be required for patterning the gate electrode material according to the specified design rules. For example, in highly sophisticated semiconductor devices, the gate length may be 50 nm and less, which may thus also impose tightly set process margins on the processes involved and also on the defect rate, for instance with respect to particle contamination and the like. For example, a typical process sequence for forming a gate electrode structure having critical dimensions in the above-specified range may comprise the following processes. First, an appropriate gate dielectric material may be formed, for instance on the basis of silicon dioxide and the like, followed by the deposition of the silicon electrode material, for instance in the form of amorphous silicon or polysilicon, which may be accomplished by using sophisticated low pressure chemical vapor deposition (CVD) techniques and the like. Thereafter, appropriate hard mask materials, such as amorphous carbon, silicon oxynitride and the like, possibly in combination, may typically be used in many approaches in order to obtain a precise patterning of an etch mask on the basis of sophisticated photoresist materials. Next, a sophisticated lithography process is performed in order to obtain a resist mask, which may be used for patterning the hard mask material or materials, wherein, during the corresponding patterning process, the resist material may be substantially consumed or may be removed in a subsequent removal process. Thereafter, the hard mask may be further treated, if required, for instance in order to obtain the desired critical dimension, and subsequently the gate electrode material, i.e., the silicon material, may be etched on the basis of highly selective etch chemistries on the basis of, for instance, hydrogen bromide and the like. The etch process may be stopped on and in the gate dielectric material which may have a thickness of 1.5 to several nanometers, depending on the device requirements, and may be thus precisely controlled at least in a final phase of the etch process. During the patterning process, the plasma assisted etch ambient is appropriately established, for instance, on the basis of polymer additives, in order to obtain the desired anisotropic etch behavior, which may provide substantially vertical sidewall surfaces of the resulting gate electrode structure. Thereafter, the hard mask material may be removed by appropriate etch recipes. Generally, in various manufacturing stages, the resulting surface of a semiconductor device may have to be cleaned, for instance, in view of undesired material residues, such as oxides and the like, as well as other contaminants in the form of organic contaminants, metal residues and the like. In particular, prior to or after critical process sequences, an efficient cleaning of the surface has to be performed. Thus, after patterning the gate electrode structure, the further processing may involve efficient cleaning recipes in view of removing any organic or metallic contaminants which may have been formed during the preceding complex patterning sequence, in particular when approaches including various hard mask materials and a corresponding patterning thereof are to be used in forming the gate electrode structure. For example, a plurality of wet chemical cleaning recipes are available, wherein some very efficient ones of these recipes may be based on aggressive chemicals, such as hydrofluoric acid (HF), which may efficiently attack silicon oxide and may thus also efficiently remove any contaminants adhering to the silicon oxide or embedded therein. Consequently, after the critical gate patterning process and after an efficient wet chemical cleaning process based on HF, the further processing may be continued by forming other basic components of field effect transistors, such as drain and source areas.

Due to the very reduced critical dimensions of transistor elements, resulting in a gate length of 50 nm and less, however, a further gain in performance may be difficult to achieve since the controllability of a short channel length associated with the reduced gate length typically requires, among other things, an appropriate adaptation of the thickness of the gate dielectric material, which, however, may result, in addition to increased process complexity in view of depositing the gate dielectric material and patterning the silicon gate electrode material, in a very pronounced increase of leakage currents, as the charge carriers may readily tunnel into and through the very thin silicon dioxide based gate dielectric material. In order to further enhance overall transistor performance without further increasing the dynamic and static leakage currents of gate electrode structures, other mechanisms have been proposed. For this purpose, the strain in the channel region may be modified, which may result in a modified charge carrier mobility. Consequently, by applying an appropriate strain component, the charge carrier mobility of electrons and holes, respectively, may be increased for a given crystallographic configuration of the silicon-based channel region. In this way, a strained silicon material may be considered as a "new" type of semiconductor material that allows the fabrication of fast and powerful semiconductor devices without requiring an even further reduced thickness of the gate dielectric material.

One very efficient mechanism is the incorporation of a strained silicon/germanium semiconductor alloy in the drain and source regions of P-channel transistors in order to create a compressive strain component in the channel region, thereby increasing hole mobility and thus the drive current of the transistor. The incorporation of the strain-inducing silicon/germanium material is typically accomplished by forming cavities laterally adjacent to the gate electrode structure and filling the cavities with the silicon/germanium alloy on the basis of a selective epitaxial growth technique. During the corresponding process sequence, the delicate gate electrode structure is to be reliably masked to avoid undue etch damage and also to avoid material deposition during the selective epitaxial growth process, which may otherwise result in non-acceptable irregularities during the further processing of the device.

To this end, typically, a cap material in the form of a silicon nitride material is formed above the polysilicon gate electrode material and is patterned together with the silicon material in order to provide a gate electrode structure having a silicon nitride cap layer on its top surface. Moreover, a silicon nitride sidewall spacer may be formed to reliably cover the sidewalls of the delicate gate electrode structure during the etch process and the subsequent selective epitaxial growth process. However, upon removing the cap material and the sidewall spacers, etch-related irregularities may be induced, as will be described with reference to the following drawings.

FIG. 1a schematically illustrates a cross-sectional view of a semiconductor device 100 comprising a substrate 101, such as a silicon substrate and the like, above which is formed a silicon-based semiconductor layer 102. Moreover, a gate electrode structure 151 is formed on the semiconductor layer 102 and comprises a gate insulation layer 151B, which separates a silicon material, such as a polysilicon material 151A, from a channel region 152. Furthermore, the gate electrode structure 151 comprises a silicon nitride cap layer 151C, as discussed above. Additionally, sidewall spacers 103 are formed on sidewalls of the gate electrode structure 151. Furthermore, in the manufacturing stage shown, a silicon/germanium alloy 153 is formed in the semiconductor layer 102 laterally offset from the gate electrode structure 151 by the spacers 103.

It should be appreciated that the semiconductor device 100 as illustrated in FIG. 1a may be formed in accordance with process techniques described above, i.e., the gate electrode structure 151 may be formed by providing the gate insulation layer 151B followed by the polysilicon material 151A in combination with the silicon nitride cap layer 151C, followed by the deposition of appropriate hard mask materials which are then patterned to form an etch mask in order to pattern the layer stack 151B, 151A, 151C. Thereafter, appropriate wet chemical cleaning processes are performed as discussed above and the spacers 103 may be formed, for instance, by depositing a silicon nitride material and anisotropically etching the same in order to provide the spacers 103. Thereafter, cavities may be formed and may be subsequently filled with the silicon/germanium material 153 on the basis of a selective epitaxial growth technique, in which a significant material deposition on dielectric surface areas may be efficiently suppressed. Consequently, during etching the cavities and depositing the material 153, the cap layer 151C in combination with the spacer 103 may maintain integrity of the gate electrode structure 151.

FIG. 1b schematically illustrates the semiconductor device 100 during a wet chemical etch process 104 that may be performed on the basis of hot phosphoric acid in order to remove the cap layer 151C and the sidewall spacer 103 (see FIG. 1a) selectively to the polysilicon material 151A. Although hot phosphoric acid may exhibit a high etch selectivity with respect to polysilicon material, nevertheless, a certain degree of material erosion or other etch-related irregularities may be caused during the process 104, in particular at a top surface 151S, which may have a significant influence on the resulting defect rate, i.e., gate failures, during the further processing of the device 100, in particular if very sophisticated semiconductor devices are considered. While significant damage of sidewall surfaces of the gate electrode material 151A may be suppressed by providing an appropriate etch stop liner, for instance in the form of a silicon dioxide material, the provision of a corresponding oxide material between the polysilicon material 151A and the cap layer 151C (FIG. 1a) may be less than desirable in sophisticated applications for the following reasons.

FIG. 1c schematically illustrates an alternative, in which the device 100 is shown after patterning the gate electrode structure 151 which includes a silicon dioxide etch stop layer 151D formed by CVD in this alternative. Consequently, after the deposition of the cap layer 151C and any hard mask materials, the patterning sequence has to be adapted so as to take into consideration the presence of the etch stop material 151D, which has to be patterned on the basis of a different etch chemistry compared to the polysilicon material 151A. Thereafter, the device 100 is subjected to an efficient wet chemical cleaning process 105 based on hydrofluoric acid, which, however, may also attack sidewalls of the etch stop material 151D.

FIG. 1d schematically illustrates the device 100 after the preceding wet chemical cleaning process which may cause notches 105N in the etch stop material 151D since, in view of enhanced controllability, the thickness of the layer 151D may not be arbitrarily reduced and may thus be approximately 5 nm and more. The pronounced notches 105N may, however, result in irregularities during the subsequent formation of the sidewall spacers, such as the spacers 103 (FIG. 1a), thereby compromising a reliable coverage of the sidewalls of the polysilicon material 151A at the notches 105N, which in turn may result in an undesired growth of silicon/germanium material.

Furthermore, in sophisticated applications, a further strategy for enhancing transistor performance without increasing the leakage currents due to a very thin gate dielectric material is the replacement of silicon dioxide based gate dielectric materials with a high-k dielectric material, which is to be understood as a dielectric material having a dielectric constant of 10.0 or higher. In this case, a significantly greater physical thickness of an appropriate high-k dielectric material may provide the same or an increased capacitive coupling, thereby maintaining channel controllability without unduly increasing the leakage currents. In this case, a corresponding gate electrode structure may require an even more complex deposition and patterning process sequence due to the provision of high-k dielectric materials, which may exhibit a very pronounced sensitivity with respect to oxygen and the like, thereby typically requiring the deposition of an appropriate cap material, for instance a titanium nitride material and the like. In many approaches, a certain degree of compatibility with conventional gate electrode structures, such as illustrated in FIGS. 1a-1d, may be maintained by providing a polysilicon material or amorphous silicon material as a place-holder material that is replaced by a work function adjusting metal-containing species and a metal gate electrode in a very advanced manufacturing stage. Thus, providing the etch stop layer 151D (FIG. 1c) in order to enhance process uniformity upon removing any silicon nitride based cap materials, which may be used as hard mask material or as cap material when incorporating a silicon/germanium material, may be less than desirable, since the etch stop layer may have to be removed prior to replacing the polysilicon placeholder material, thereby also negatively affecting other silicon dioxide based materials, such as an interlayer dielectric material, which is provided for embedding the gate electrode structure prior to replacing the polysilicon material.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides techniques in which a thin silicon dioxide based etch stop material may be provided with a high degree of controllability, thereby enabling efficient removal of a silicon nitride based sacrificial material layer. The reduced thickness and superior uniformity, for instance with respect to material composition and layer thickness, may thus allow the incorporation of a silicon nitride material in combination with an efficient etch stop material, wherein the presence of the etch stop material may not unduly affect the further processing of the device. In some illustrative aspects disclosed herein, the material system of a thin etch stop layer in combination with a silicon nitride based material may be applied to sophisticated gate electrode structures, thereby allowing the removal of the sacrificial silicon nitride based material, while the reduced thickness and superior uniformity of the etch stop material may not substantially negatively influence the further processing, for instance, in view of selectively depositing a strain-inducing semiconductor alloy and/or removing a placeholder gate electrode material in a very advanced stage, as may be required in some replacement gate approaches. The thin etch stop material may be formed on the basis of a highly controllable chemical oxidation process by using appropriate oxidizing chemicals, which may thus result in superior process controllability compared to conventional strategies using CVD-based techniques or even plasma assisted oxidation recipes.

One illustrative method disclosed herein comprises forming a silicon oxide based etch stop layer with a thickness of approximately 10 Å or less on a silicon layer that is formed above a substrate of a semiconductor device. The method further comprises forming a sacrificial cap material above the etch stop layer, wherein the sacrificial cap material comprises silicon and nitrogen. The method further comprises patterning the sacrificial cap material, the silicon oxide based etch stop layer and the silicon layer so as to form a device feature. Moreover, a wet chemical cleaning process is performed on the device feature and the semiconductor device is exposed to at least one reactive process ambient by using the sacrificial cap material as a protective cap of the device feature. Finally, the method comprises removing the sacrificial cap material selectively to the etch stop layer.

A further illustrative method disclosed herein comprises forming an etch stop layer on a silicon-containing material layer by performing a wet chemical oxidation process. The method further comprises forming a dielectric cap material above the etch stop layer and forming a gate electrode structure by patterning the silicon-containing material layer, the etch stop layer and the dielectric cap material. Furthermore, the method comprises exposing the gate electrode structure to at least one reactive process ambient while using the dielectric cap material as a protective material. Additionally, the method comprises removing the dielectric cap material after exposure to the at least one reactive process ambient selectively to the etch stop layer on the basis of a wet chemical etch ambient.

A still further illustrative method disclosed herein comprises forming a silicon-containing electrode material on a gate dielectric layer that is formed on a semiconductor region. The method further comprises performing a wet chemical oxidation process so as to form an oxide layer on the silicon-containing electrode material. The method additionally comprises forming a cap material above the oxide layer, wherein the cap material comprises silicon and nitrogen. The method further comprises patterning the silicon-containing electrode material, the oxide layer and the cap material on the basis of an etch mask formed above the cap material so as to provide a gate electrode structure. Furthermore, a wet chemical treatment is performed on the gate electrode structure and one or more processes are performed while using the cap material as a mask. Additionally, the method comprises removing the cap material on the basis of a wet chemical etch process by using the oxide layer as an etch stop layer.

BRIEF DESCRIPTION OF THE DRAWINGS

The disclosure may be understood by reference to the following description taken in conjunction with the accompanying drawings, in which like reference numerals identify like elements, and in which.

Figure 1A:
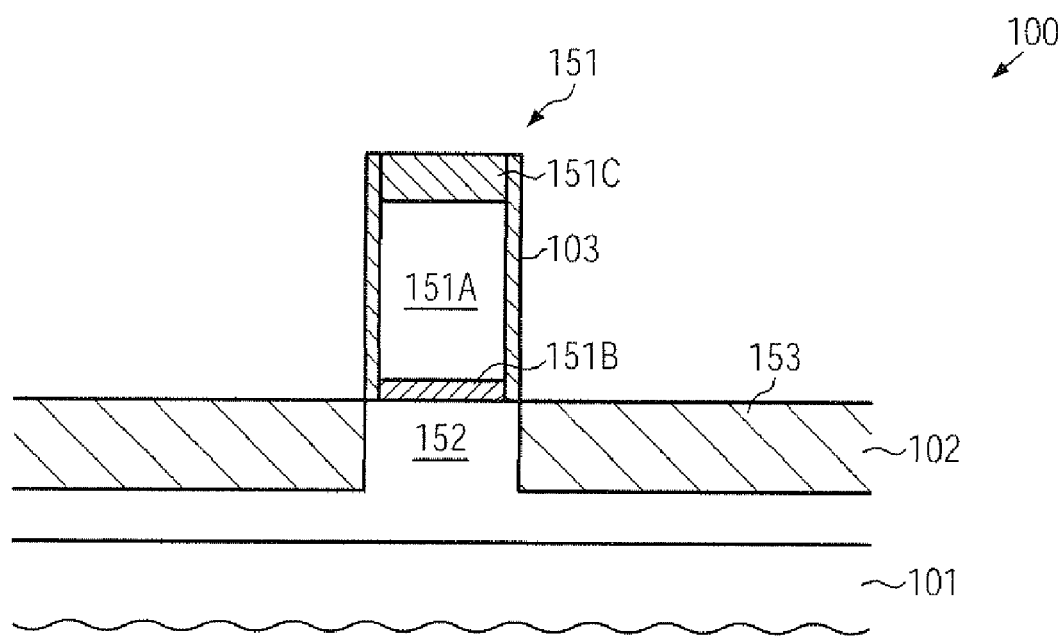
FIGS. 1a-1b schematically illustrate a conventional semiconductor device during various manufacturing stages in providing an embedded silicon/germanium semiconductor alloy on the basis of an encapsulated gate electrode structure, which may be exposed on the basis of a hot phosphoric acid process, according to conventional strategies.
Figure 1B:
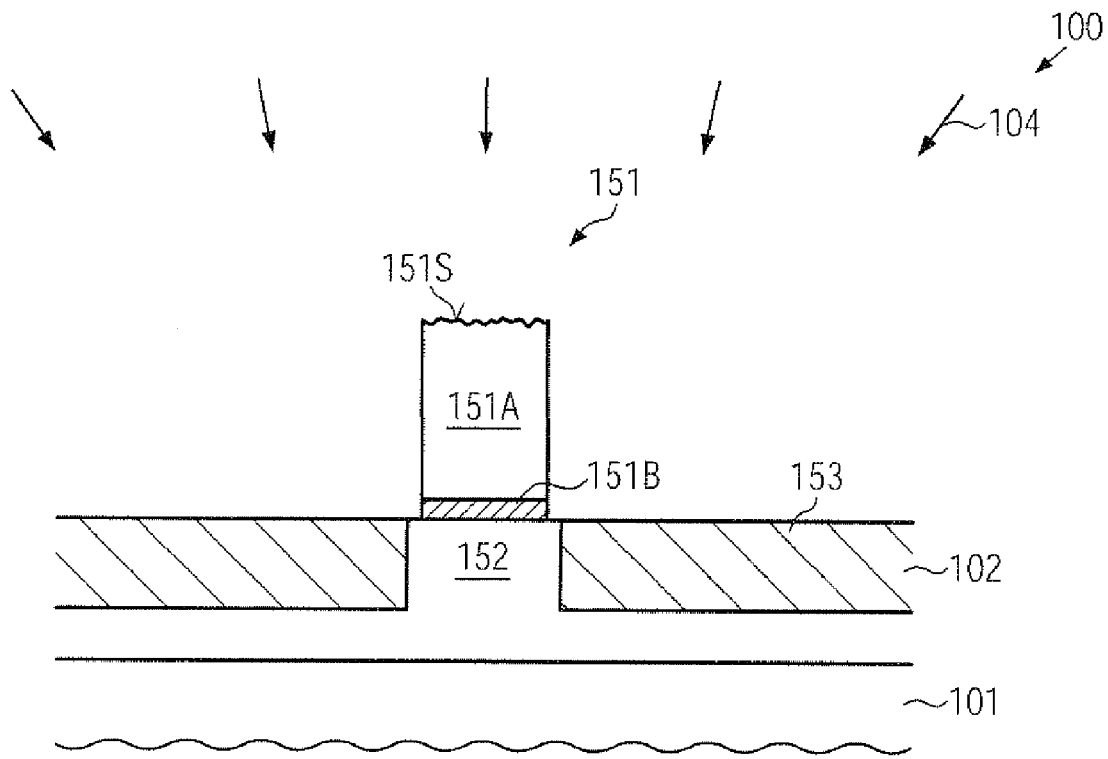
Figure 1C:
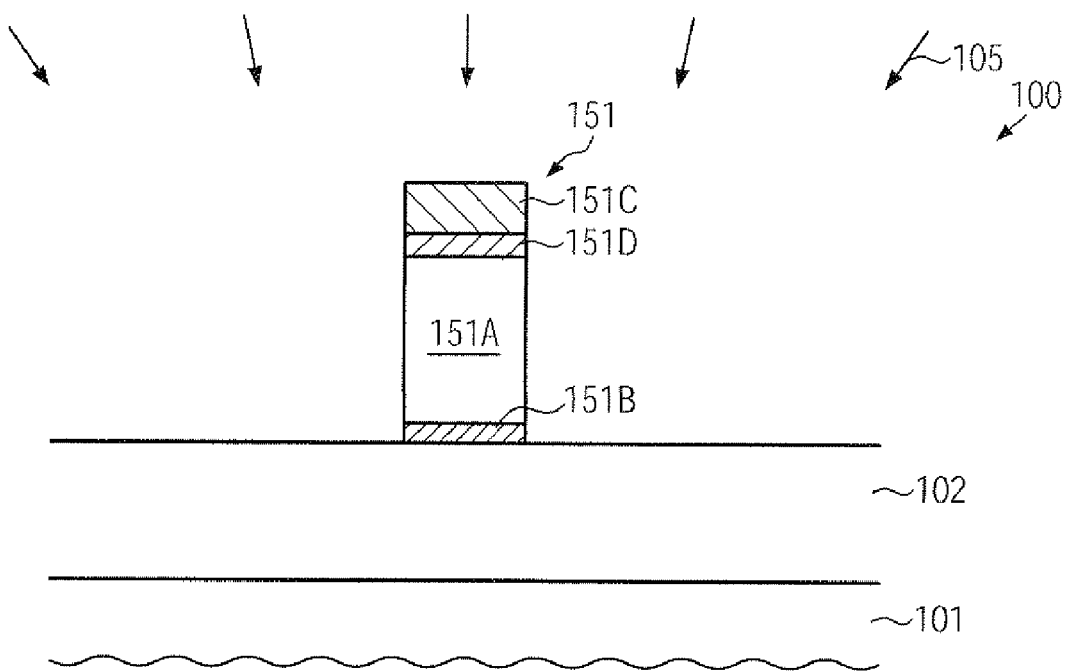
FIGS. 1c-1d schematically illustrate the gate electrode structure including a silicon dioxide etch stop layer formed on the basis of CVD techniques that results in irregularities during the further processing, according to conventional strategies.
Figure 1D:
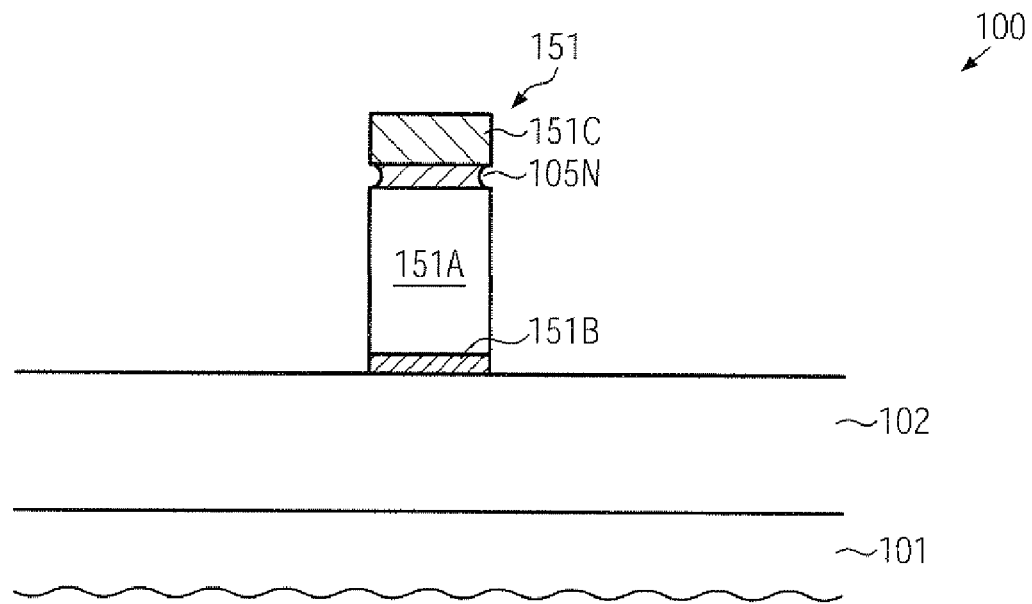

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to techniques for providing a thin silicon dioxide based etch stop layer on the basis of a chemically driven oxidation process with a high degree of controllability by applying appropriate chemicals so that a reduced thickness may be achieved, for instance in the range of approximately 10 Å and less, which may result, due to the superior process uniformity, with sufficient etch stop capabilities, without unduly affecting the further processing of the device. In some illustrative embodiments, a layer stack comprising a silicon-containing material, which may require a sophisticated silicon nitride based cap material, may be formed with the intermediate thin and highly uniform etch stop material such that any desired device feature may be patterned from the resulting layer stack, wherein the etch stop layer may provide reliable and efficient removal of the sacrificial silicon and nitrogen based material, for instance on the basis of well-established wet chemical etch recipes, such as hot phosphoric acid, without unduly causing irregularities of the silicon-based material. On the other hand, the thin and uniform etch stop layer may not unduly affect the processing of the device feature, for instance in the form of a gate electrode structure, when performing efficient chemical cleaning processes, for example using hydrofluoric acid followed by an encapsulation of the device feature, for instance in view of selectively depositing a strain-inducing semiconductor alloy. That is, due to the very reduced thickness as compared to conventional strategies, the wet chemical cleaning process may not unduly result in surface irregularities, which may conventionally result in a less reliable coverage, for instance, of sidewall areas, as previously discussed. Similarly, due to the reduced thickness, the presence of the etch stop material in other process stages, such as a process phase for removing the silicon-based material in order to provide a work function adjusting material and a metal gate electrode material in a replacement gate approach, may not negatively influence the process sequence since the very thin etch stop layer may be efficiently removed without causing undue material erosion of other dielectric materials.

It should be appreciated that the principles disclosed herein may be very advantageous in the context of forming sophisticated gate electrode structures, which may require enhanced patterning techniques, for instance based on hard mask materials and efficient wet chemical cleaning recipes, in combination with the incorporation of strain-inducing materials, since here the overall process uniformity may be significantly enhanced without introducing any other process-related irregularities. On the other hand, the principles disclosed herein may also be applied to the formation of any device features in which a sacrificial silicon and nitrogen based material has to be provided above a silicon-containing material wherein the presence of an etch stop material of increased thickness, for instance with a thickness of 2 nm or more, may not be compatible with the further processing of the device.

With reference to FIGS. 2a-2h further illustrative embodiments will now be described in more detail, wherein reference may also be made to FIGS. 1a-1d, if appropriate.

Figure 2A:
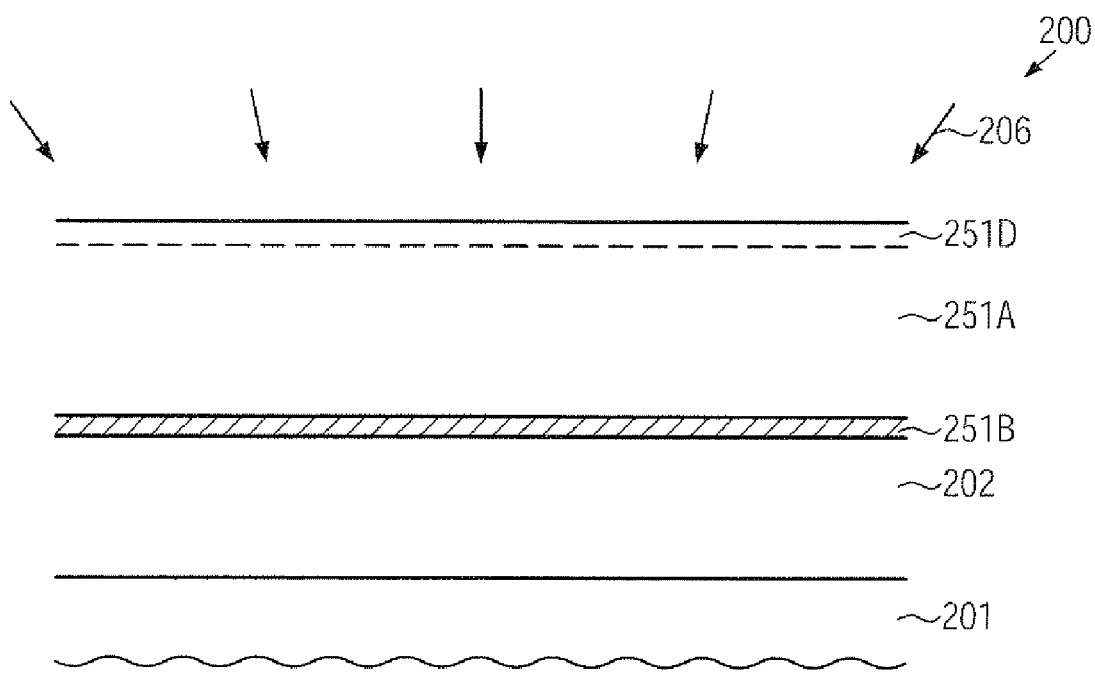
FIG. 2a schematically illustrates a cross-sectional view of a layer stack of a semiconductor device in which a thin silicon dioxide based etch stop layer may be formed on the basis of a chemical oxidation process, according to illustrative embodiments.

FIG. 2a schematically illustrates a cross-sectional view of a semiconductor device 200 comprising a substrate 201 above which may be formed a semiconductor layer 202, for instance comprising silicon, germanium, carbon or any other species for providing the desired electronic characteristics of the semiconductor layer 202. Furthermore, in some cases, or at least locally, a buried insulating layer (not shown) may be positioned between the substrate 201 and the semiconductor layer 202 in order to provide a silicon-on-insulator (SOI) configuration. It should be appreciated that, in the manufacturing stage shown, the semiconductor layer 202 may comprise any type of isolation structures (not shown) as may typically be provided so as to laterally delineate corresponding "active" regions, which are to be understood as semiconductor regions in which one or more PN junctions are to be formed in a later manufacturing stage. Furthermore, the device 200 may comprise a stack of layers 251B, 251A and 251D, wherein the layer 251A may represent a silicon-containing material, such as an amorphous or polycrystalline silicon material, a silicon/germanium material and the like. On the other hand, the layer 251B may represent a dielectric material, such as a silicon oxide based dielectric material which may have a thickness of approximately 1.5 to several nanometers, possibly in combination with other atomic species, such as nitrogen and the like. As will be discussed later on in more detail, in some illustrative embodiments, the dielectric layer 251B may comprise a high-k dielectric material, possibly in combination with a silicon oxide based material when sophisticated semiconductor devices are considered, in which the layer stack is to be patterned into a sophisticated high-k gate electrode structure. It should be appreciated that the material composition and the thickness of the layers 251B, 251A may be appropriately adapted to the device requirements, for instance for forming any appropriate device feature from these layers, such as a gate electrode structure and the like. Furthermore, in the manufacturing stage shown, the illustrative etch stop layer 251D, representing a silicon and oxygen containing material layer, may be formed on or in the layer 251A with a thickness that may provide the desired etch stop capabilities in a later manufacturing stage, however, without unduly affecting the further processing of the device 200. In some illustrative embodiments, the layer 251D may be provided as an oxide layer having a thickness of approximately 10 Å or less, such as approximately 7 Å or less.

The semiconductor device 200 as illustrated in FIG. 2a may be formed on the basis of well-established process techniques with respect to the layers 251B and 251A in accordance with the overall device requirements. For example, when representing a gate layer stack, the layers 251B, 251A may be formed on the basis of process techniques as previously described. Moreover, the device 200 may be exposed to a process ambient 206 in order to form the etch stop layer 251D on the basis of a chemically activated oxidation process by supplying appropriate chemical species to the surface of the layer 251A. For this purpose, ozone and/or hydrogen peroxide containing reagents may be applied, for instance, by using any appropriate process environment, such as wet chemical etch reactors and the like. In this case, the appropriate chemicals may be supplied in the form of liquids, droplets and the like, while in other cases respective chemicals may be evaporated so as to be brought into contact with the layer 251A. For example, chemicals such as a mixture of ozone and de-ionized water, a mixture of ozone and sulfuric acid, a mixture of sulfuric acid and hydrogen peroxide, a mixture of ammonium hydroxide and hydrogen peroxide and the like may be used as efficient chemical reagents for initiating oxidation of a portion of the material of the layer 151A. Consequently, during the chemically driven oxidation process 206, contrary to conventional CVD deposition processes or plasma driven oxidation processes, which may suffer from reduced process controllability or uniformity with respect to layer thickness and material composition, a highly uniform and well-controllable oxide material may be formed. Hence, the etch stop layer 251D may be provided with a thickness in the above-specified range.

Figure 2B:
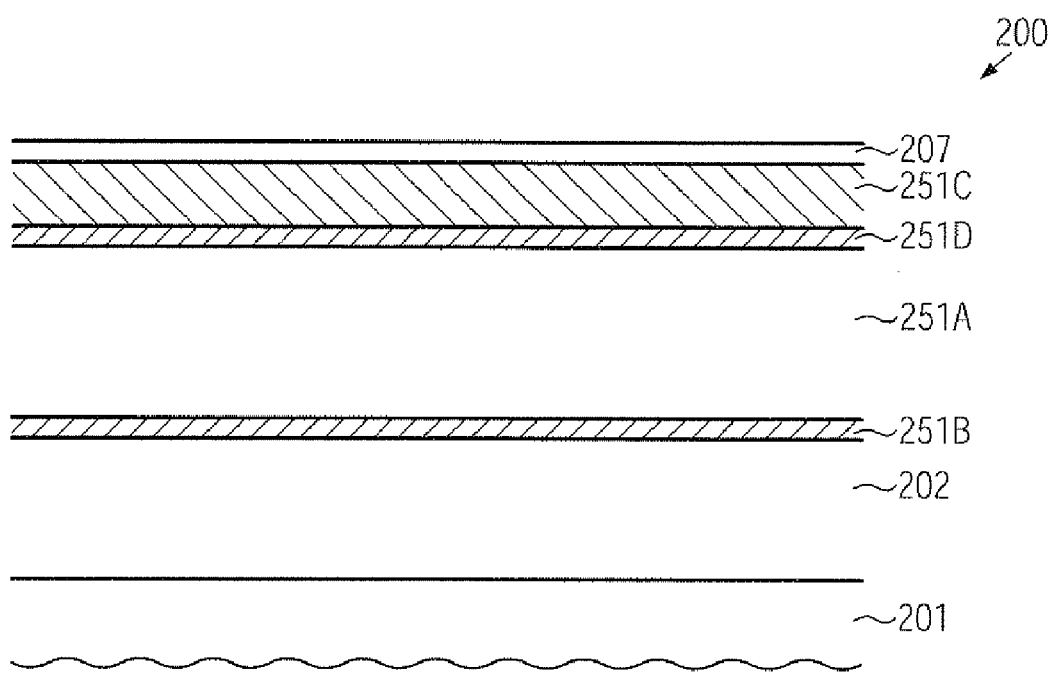
FIG. 2b schematically illustrates a cross-sectional view of the layer stack in a further advanced manufacturing stage, wherein the layer stack may represent a gate layer stack for forming sophisticated gate electrode structures, according to illustrative embodiments.

FIG. 2b schematically illustrates the semiconductor device 200 in a further advanced manufacturing stage in which a cap layer 251C in the form of a silicon and nitrogen containing material may be formed above the etch stop layer 251D. For example, the layer 251C may be referred to as a silicon nitride material, wherein the exact composition may be substantially determined by the process of forming the layer 251C. Hence, additional species, such as hydrogen and the like, may be present in a varying amount, while other components, such as carbon, may also be contained in the layer 251C, if considered appropriate for the characteristics in view of the further processing of the device 200. The layer 251C may be formed on the basis of any well-established process techniques wherein, however, compared to conventional strategies in which an oxide-based etch stop layer may not be provided, the deposition process may "see" a deposition surface as having silicon oxide-like characteristics, thereby providing superior process conditions. For example, the deposition of a silicon nitride material on a silicon dioxide etch stop layer may frequently be applied during the formation of sidewall spacers and the like. Moreover, in the manufacturing stage shown, the device 200 may comprise any additional materials 207 as required for the patterning of the underlying layer stack. For example, the materials 207 may include hard mask materials, for instance in the form of amorphous carbon and the like, possibly in combination with other materials such as silicon oxynitride materials in order to adjust the reflectivity of an exposure wavelength to be used for patterning the material 207 on the basis of a resist material and the like. The additional materials 207 may also be provided on the basis of well-established process techniques. Thereafter, the layer stack as shown in FIG. 2b may be patterned by similar process techniques as previously explained, wherein the layer 207 may be patterned and may be used as an etch mask for patterning the layers 251C and 251D, followed by an appropriate etch step for etching through the material 251A selectively to the material 251B, as is also previously explained.

Figure 2C:
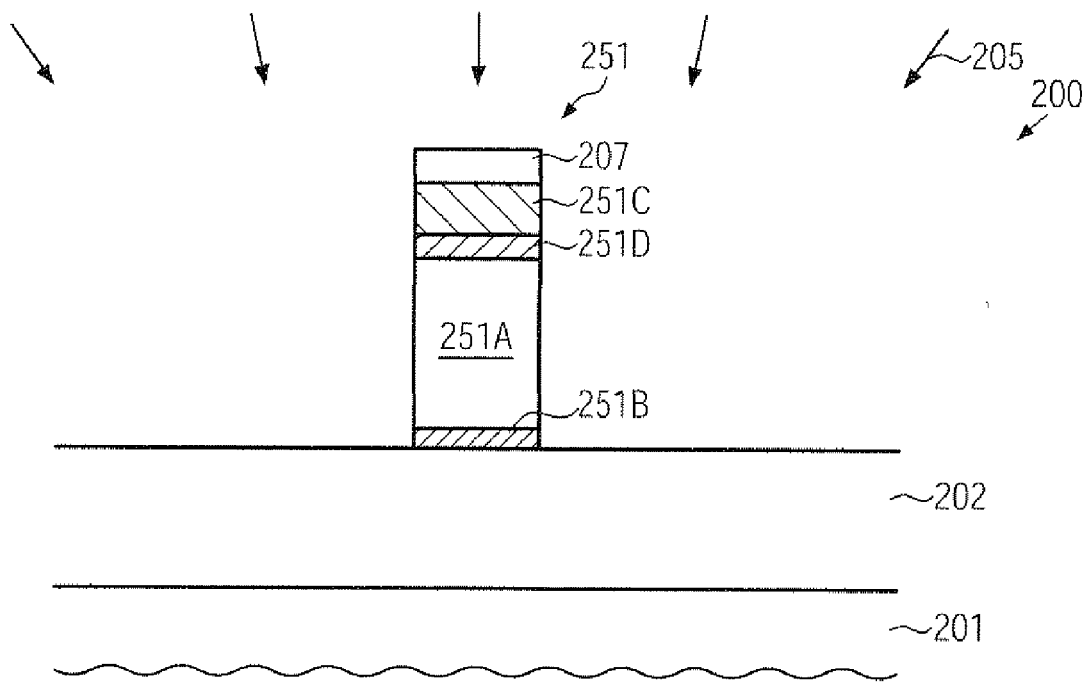
FIGS. 2c-2e schematically illustrate the semiconductor device in further advanced manufacturing stages in which an embedded strain-inducing semiconductor alloy may be formed on the basis of a sophisticated gate electrode structure including a thin etch stop material between the electrode material and a corresponding silicon nitride cap material, according to further illustrative embodiments.

FIG. 2c schematically illustrates the device 200 with a device feature 251 comprising the layers 251B, 251A, 251D, 251C and residues of the layer 207. In one illustrative embodiment, the device feature 251 may represent a gate electrode structure of a transistor still to be formed in the further process sequence. For example, a length of the gate electrode structure 251, i.e., the horizontal extension of the silicon-containing material 251A, may be approximately 50 nm and less, such as 30 nm and less. Moreover, the device 200 may be subjected to a wet chemical cleaning process 205 which may be performed on the basis of hydrofluoric acid (HF) in order to remove contaminants in the form of organic materials, metal species, particles and the like, as previously explained. Due to the reduced thickness of the etch stop layer 251D, a corresponding material erosion at exposed sidewall areas thereof may be significantly reduced or may be substantially completely avoided, contrary to conventional strategies in which a moderately pronounced thickness of several nanometers may result in a pronounced "notching" of the sidewalls of the gate electrode structures (see FIG. 1d).

Figure 2D:
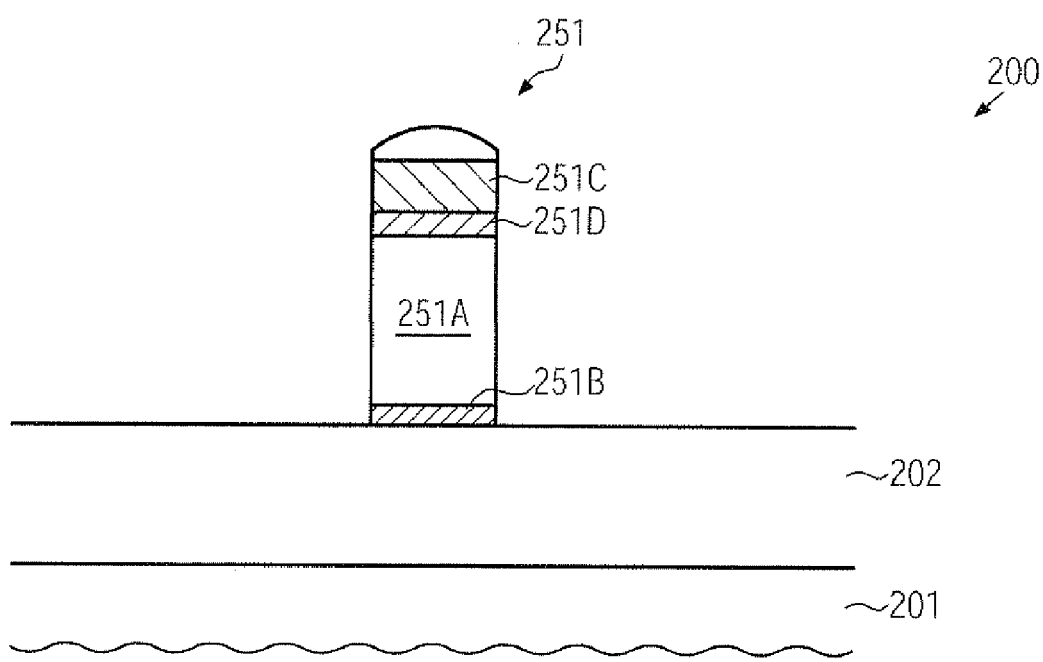

FIG. 2d schematically illustrates the semiconductor device 200 after cleaning the exposed surface areas, thereby providing a substantially intact overall structure of the device feature 251. In this manufacturing stage, the further processing may be continued, as is also previously described with the device 100, by performing additional process steps, for instance, by establishing at least one reactive process environment in which the cap layer 251C may reliably protect the material 251A. In some illustrative embodiments, the further processing may involve the deposition of a spacer material, possibly in combination with an etch stop liner, and patterning the spacer material so as to form sidewall spacers on sidewalls of the device feature 251, as is also previously described, wherein the superior integrity of the sidewall of the device feature 251 may provide superior uniformity of the resulting sidewall spacer. Consequently, a similar configuration may be obtained, as is previously described with reference to FIG. 1a, in which an intermediate etch stop material in the gate electrode structure 251 is not incorporated. Thereafter, the further processing may be continued, for instance, by forming cavities using the cap layer 251C as an efficient etch mask and subsequently depositing a strain-inducing semiconductor alloy, such as a silicon/germanium alloy, a silicon/tin alloy, a silicon/germanium/tin alloy, a silicon/carbon alloy and the like. Also, in this case, the cap layer 251C in combination with the corresponding sidewall spacers (not shown) may act as an efficient mask material.

Figure 2E:
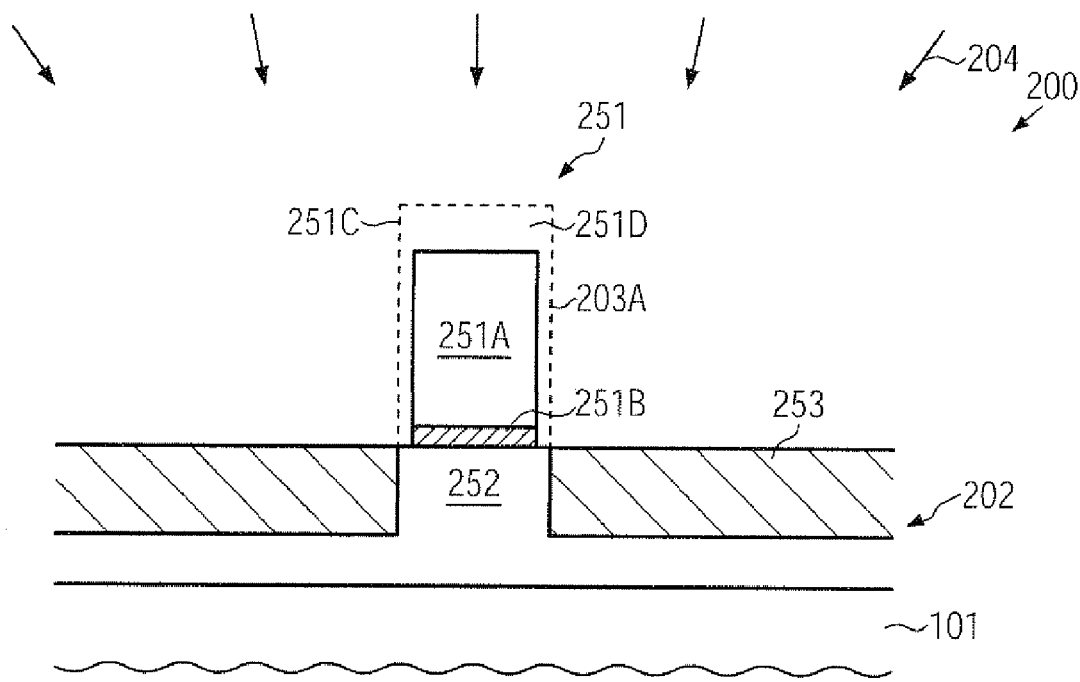

FIG. 2e schematically illustrates the semiconductor device 200 in a further advanced manufacturing stage. As illustrated, a strain-inducing semiconductor alloy 253 may be formed in the semiconductor layer 202 laterally offset from the device feature 251, which may represent a gate electrode structure. Moreover, the device 200 may be exposed to an etch ambient 204, for instance established on the basis of hot phosphoric acid in order to remove the cap layer 251C selectively to the etch stop layer 251D, while also removing sidewall spacers (not shown) possibly selectively to any etch stop liner 203A, which may be provided in combination with the sidewall spacers, as is also previously explained. Due to the superior uniformity of the etch stop material 251D, the material 251A may be reliably protected during the process 204, despite the reduced thickness of the layer 251D.

Thereafter, the further processing may be continued on the basis of any process techniques as may be required for forming drain and source regions in the semiconductor layer 202 and/or for forming a sophisticated gate electrode structure including metal-containing electrode materials on the basis of the device feature 251.

Figure 2F:
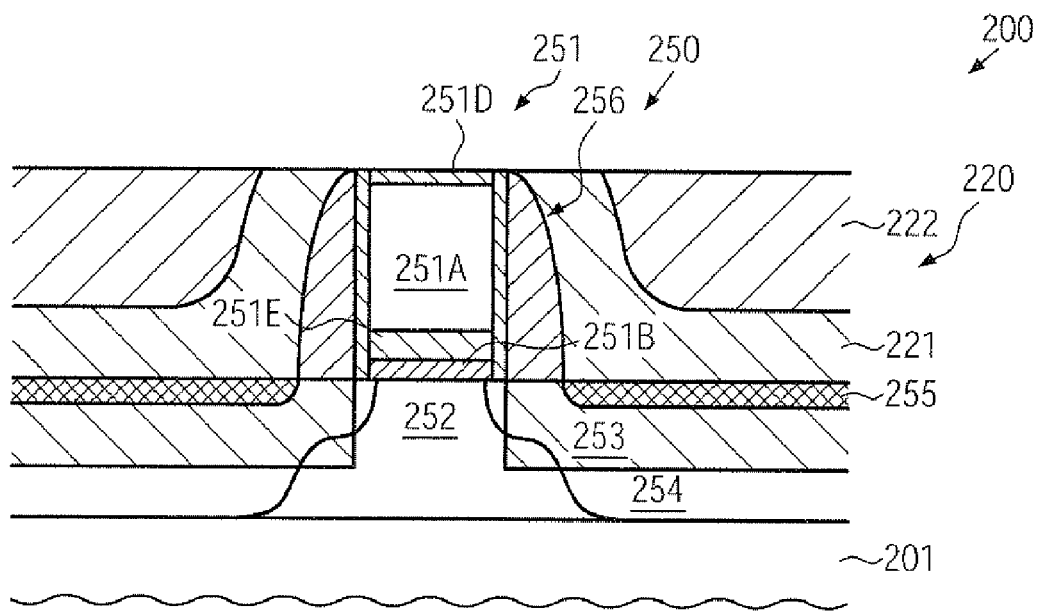
FIGS. 2f-2h schematically illustrate cross-sectional views of the semiconductor device according to still further illustrative embodiments in which a silicon gate material may be replaced in a very advanced manufacturing stage without significantly being affected by the presence of a thin silicon dioxide based etch stop layer.

FIG. 2f schematically illustrates the semiconductor device 200 according to illustrative embodiments in which a sophisticated gate electrode structure is to be provided on the basis of a replacement gate approach. As illustrated, the device 200 may comprise a transistor 250 having the embedded strain-inducing semiconductor alloy 253 and drain and source regions 254 laterally enclosing a channel region 252. Furthermore, metal silicide regions 255 may be formed in the material 253. Additionally, the device feature 251, which is now referred to as a gate electrode structure, may comprise the etch stop material 251D, the material 251A and the gate insulation layer 251B, which may comprise a high-k dielectric material, such as hafnium oxide, hafnium silicon oxide, zirconium oxide and the like, possibly in combination with a "conventional" dielectric material, such as silicon dioxide. Furthermore, due to the high sensitivity of high-k dielectric materials when exposed to reactive atmospheres or to oxygen and water, a metal-containing cap material 251E may typically be provided on the gate insulation layer 251B, followed by the material 251A, possibly in combination with an intermediate etch stop layer (not shown), if considered appropriate. Furthermore, the gate electrode structure 251 may be laterally enclosed by a sidewall spacer structure 256 and an interlayer dielectric material 220, which may be provided in the form of a first dielectric material 221, such as a silicon nitride material, a nitrogen-containing silicon carbide material and the like, and a second dielectric material 222, for instance, a silicon dioxide material.

The semiconductor device 200 as illustrated in FIG. 2f may be formed on the basis of well-established process techniques which may include the formation of drain and source regions 254 in combination with providing the spacer structure 256, followed by the formation of the metal silicide regions 255. Thereafter, the interlayer dielectric material 220 may be formed, for instance, by depositing the layer 221, possibly as a highly stressed dielectric material, followed by the deposition of the material 222. The surface topography may be planarized and excess material may be removed, for instance on the basis of chemical mechanical polishing (CMP) and the like. During this removal process, the gate electrode structure 251 may be exposed, i.e., the etch stop layer 251D may be exposed, while in other cases the layer 251D may be efficiently removed without unduly contributing to a significant material erosion of other device components, such as the interlayer dielectric material 220. In other cases, a dedicated etch step may be performed after exposing the material 251D or residues thereof, for instance based on hydrofluoric acid, thereby also avoiding undue material erosion of the interlayer dielectric material 220 due to the very reduced thickness of the etch stop layer 251D. Consequently, the material 251A may be efficiently exposed without unduly affecting other device components.

Figure 2G:
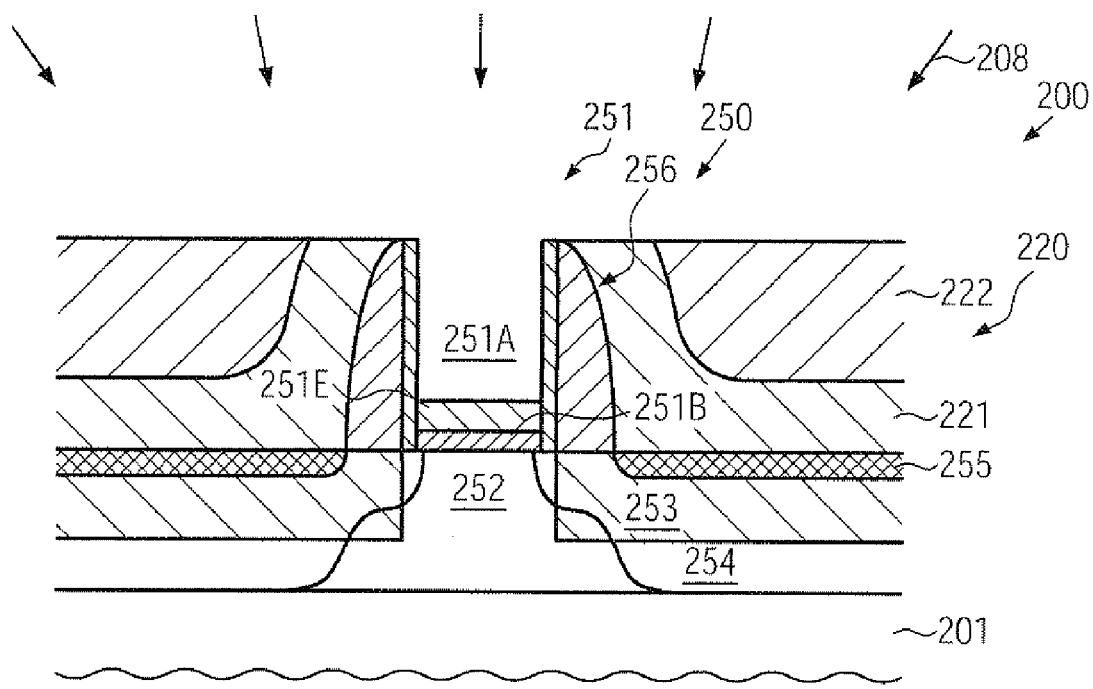

FIG. 2g schematically illustrates the semiconductor device 200 when exposed to an etch ambient 208 in order to remove the material 251A. This may be accomplished on the basis of selective wet chemical or plasma assisted etch recipes, wherein the process 208 may be stopped on or above the conductive cap layer 251E.

Figure 2H:
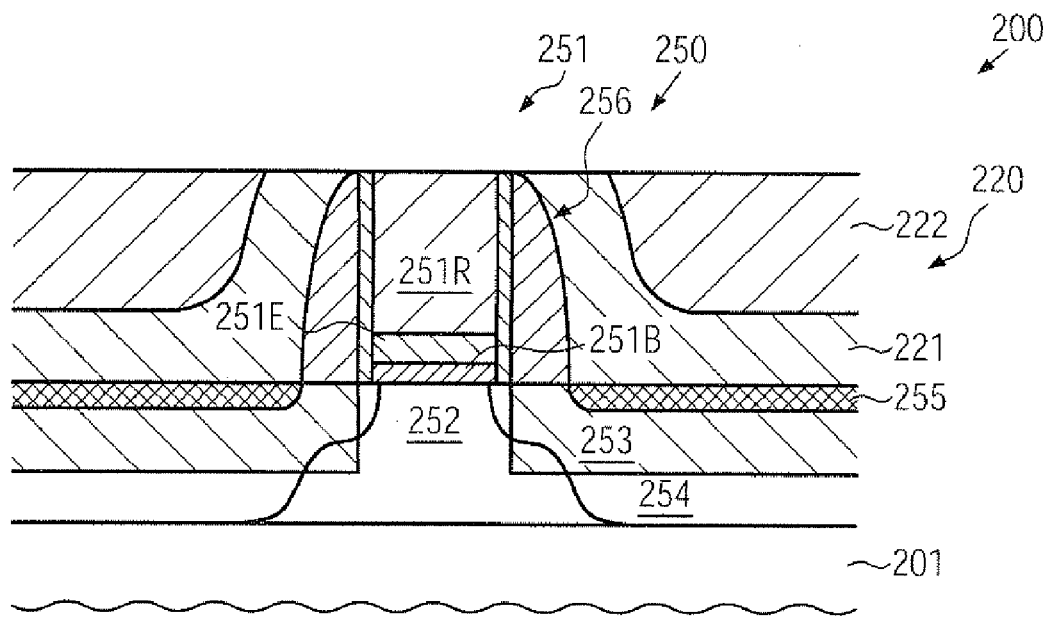

FIG. 2h schematically illustrates the semiconductor device 200 in a further advanced manufacturing stage in which the gate electrode structure 251 may comprise a gate electrode material 251R, possibly in combination with a work function adjusting species (not shown), which may be incorporated into the structure 251 by appropriate deposition techniques, followed by removal of any excess material, which may be accomplished by CMP and the like.

As a result, the present disclosure provides process techniques in which sophisticated gate layer stacks including a silicon-containing material may be efficiently processed by using a sacrificial silicon and nitrogen based material by providing, in one illustrative embodiment, an intermediate very thin silicon oxide based etch stop material having a thickness of approximately 10 Å or less. The etch stop layer may be formed on the basis of a well-controllable chemically driven oxidation process by using appropriate reagents, thereby providing superior uniformity with respect to layer thickness and material composition, such that sufficient etch stop capabilities may be provided for removing the sacrificial silicon and nitrogen containing material while not unduly affecting the processing of the material layer stack, for instance when forming sophisticated gate electrode structures and the like. In particular, efficient wet chemical cleaning processes may be applied without unduly compromising an exposed sidewall surface of the very thin etch stop material, so that efficient process strategies may be applied in combination with sophisticated gate electrode structures.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a silicon oxide based etch stop layer with a thickness of approximately 10 Å or less on a silicon-containing layer that is formed above a substrate of a semiconductor device;
   forming a sacrificial cap material above said etch stop layer, said sacrificial cap material comprising silicon and nitrogen;
   patterning said sacrificial cap material, said silicon oxide based etch stop layer and said silicon-containing layer so as to form a device feature;
   performing a wet chemical cleaning process on said device feature;
   exposing said semiconductor device to at least one reactive process ambient by using said sacrificial cap material as a protective cap of said device feature; and
   removing said sacrificial cap material selectively to said etch stop layer.

2. The method of claim 1, further comprising forming a dielectric layer above a crystalline semiconductor material formed above said substrate and wherein said silicon-containing layer is formed above said dielectric layer.

3. The method of claim 2, wherein forming said dielectric layer comprises forming a high-k dielectric material.

4. The method of claim 3, further comprising forming an interlayer dielectric material so as to laterally enclose said device feature and replacing said silicon-containing layer of said device feature by a metal-containing material.

5. The method of claim 4, wherein replacing said silicon-containing layer of said device feature comprises exposing a surface of said device feature, removing said etch stop layer and removing said silicon layer.

6. The method of claim 1, wherein exposing said semiconductor device to at least one reactive process ambient comprises forming a sidewall liner on sidewalls of said device feature and forming a cavity in a semiconductor region laterally offset from said device feature.

7. The method of claim 6, further comprising filling said cavity with a silicon-containing semiconductor alloy by performing a selective epitaxial growth process and using said sacrificial cap material as a growth mask.

8. The method of claim 1, further comprising forming drain and source regions in a semiconductor region and using said device feature as a gate electrode structure.

9. The method of claim 1, wherein forming said etch stop layer comprises exposing said silicon layer to a wet chemical ambient.

10. The method of claim 9, wherein said wet chemical ambient is established on the basis of at least one of ozone and hydrogen peroxide.

11. The method of claim 10, wherein said wet chemical ambient comprises at least one of an ozone solution, an ozone/sulfuric acid mixture, a sulfuric acid/hydrogen peroxide mixture, sodium hydroxide and hydrogen peroxide containing mixture and ammonium hydroxide and hydrogen peroxide containing mixture.

12. The method of claim 1, wherein said wet chemical cleaning process is performed on the basis of hydrofluoric acid.

13. The method of claim 1, further comprising forming a hard mask material above said cap material and forming said device feature on the basis of said hard mask material.

14. A method, comprising:
    forming an etch stop layer on a silicon-containing material layer by performing a wet chemical oxidation process;
    forming a dielectric cap material above said etch stop layer;
    forming a gate electrode structure by patterning said silicon-containing material layer, said etch stop layer and said dielectric cap material;
    exposing said gate electrode structure to at least one reactive process ambient while using said dielectric cap material as a protective material; and
    removing said dielectric cap material after exposure to said at least one reactive process ambient selectively to said etch stop layer on the basis of a wet chemical etch ambient.

15. The method of claim 14, wherein said etch stop layer is formed with a thickness of approximately 10 Å or less.

16. The method of claim 14, further comprising performing a wet chemical cleaning process on said gate electrode structure prior to exposure to said at least one reactive process ambient.

17. The method of claim 14, wherein exposing said gate electrode structure comprises forming a cavity in a semiconductor region laterally offset to said gate electrode structure and filling said cavity with a silicon-containing semiconductor alloy by using said dielectric cap material as a mask.

18. The method of claim 14, further comprising forming a gate dielectric layer on a semiconductor region prior to forming said silicon-containing material layer, wherein said gate dielectric layer comprises a high-k dielectric material.

19. The method of claim 18, further comprising replacing said silicon-containing material layer of said gate electrode structure by a metal-containing electrode material.

20. A method, comprising:
forming a silicon-containing electrode material on a gate dielectric layer formed on a semiconductor region;
performing a wet chemical oxidation process so as to form an oxide layer on said silicon-containing electrode material;
forming a cap material above said oxide layer, said cap material comprising silicon and nitrogen;
patterning said silicon-containing electrode material, said oxide layer and said cap material on the basis of an etch mask formed above said cap material so as to form a gate electrode structure;
performing a wet chemical treatment on said gate electrode structure;
performing one or more processes while using said cap material as a mask; and
removing said cap material on the basis of a wet chemical etch process by using said oxide layer as an etch stop layer.

21. The method of claim 20, wherein said oxide layer is formed with a thickness of approximately 10 Å or less.

22. The method of claim 20, wherein said wet chemical treatment is performed on the basis of hydrofluoric acid.

23. The method of claim 20, further comprising forming said gate dielectric layer so as to comprise a high-k dielectric material.

24. The method of claim 23, further comprising removing said silicon-containing electrode material after forming drain and source regions in said semiconductor region.

25. The method of claim 20, wherein performing said one or more processes comprises forming a strain-inducing semiconductor alloy in said semiconductor region.

* * * * *